United States Patent
Kishimoto et al.

(10) Patent No.: US 8,450,761 B2
(45) Date of Patent: May 28, 2013

(54) PACKAGE FOR LIGHT EMITTING ELEMENT ACCOMMODATION CONTAINING A SUBSTRATE AND A FRAME BODY, THE FRAME BODY CONTAINING ALUMINA AND BARIUM

(75) Inventors: Keiichi Kishimoto, Tokyo (JP); Makoto Ida, Tokyo (JP); Yoshiaki Teraishi, Toyama (JP)

(73) Assignee: Nippon Carbide Industries Co., Inc., Tokyo (JP)

( * ) Notice: Subject to any disclaimer, the term of this patent is extended or adjusted under 35 U.S.C. 154(b) by 0 days.

(21) Appl. No.: 13/271,013

(22) Filed: Oct. 11, 2011

(65) Prior Publication Data
US 2012/0025255 A1 Feb. 2, 2012

Related U.S. Application Data

(62) Division of application No. 12/094,551, filed as application No. PCT/JP2006/323233 on Nov. 21, 2006, now abandoned.

(30) Foreign Application Priority Data

Nov. 21, 2005 (JP) ................. 2005-335599

(51) Int. Cl.
*H01L 33/00* (2010.01)
(52) U.S. Cl.
USPC ...................... 257/98; 257/684; 257/E33.068
(58) Field of Classification Search
USPC ................... 257/98, 684; 438/29; 252/182.35
See application file for complete search history.

(56) References Cited

U.S. PATENT DOCUMENTS

| | | | |
|---|---|---|---|
| 2003/0008765 A1 | 1/2003 | Niwa et al. | |
| 2004/0208210 A1* | 10/2004 | Inoguchi | 372/36 |
| 2006/0183625 A1 | 8/2006 | Miyahara | |

FOREIGN PATENT DOCUMENTS

| | | |
|---|---|---|
| JP | 2002-338336 | 11/2002 |
| JP | 2004-119735 | 4/2004 |
| JP | 2004-224641 | 8/2004 |
| JP | A-2004-228531 | 8/2004 |
| JP | 2004-311467 | 11/2004 |
| JP | 2005-136019 | 5/2005 |
| JP | 2005-179147 | 7/2005 |

OTHER PUBLICATIONS

International Search Report mailed Dec. 19, 2006 in corresponding International Application No. PCT/JP2006/323233.

(Continued)

*Primary Examiner* — A. Sefer
(74) *Attorney, Agent, or Firm* — Scully, Scott, Murphy & Presser, P.C.

(57) ABSTRACT

To provide a package for light emitting element accommodation that realizes enhanced reflectance without application of a metal plating onto a ceramic. There is provided a package for light emitting element accommodation comprising ceramic substrate (2) having conductor mounting region (8) for mounting of light emitting element (1) on its upper surface; frame (4) of a light reflecting material containing 74.6 mass % or more of alumina whose average particle diameter after sintering is 2.5 μm or less, the frame (4) disposed on an upper surface of the substrate (2) in such a fashion that internal circumferential surface (7) of through-hole (3) expands outward; and light emitting element (1) mounted on the conductor mounting region (8) of the substrate (2). Thus, the reflectance of the frame (4) is enhanced without application of a metal plating thereonto.

4 Claims, 10 Drawing Sheets

OTHER PUBLICATIONS

Chinese Official Action mailed Jul. 3, 2009 in corresponding Chinese Patent Application No. 200680043570.2, together with an English language translation.
English translation of International Preliminary Report on Patentability together with Written Opinion mailed Jun. 11, 2008 in corresponding International Application No. PCT/JP2006/323233.
Machine translation of Japanese Patent Application Publication No. 2004-119735 dated Apr. 15, 2004.
U.S. Office Action mailed Aug. 12, 2010 in parent, U.S. Appl. No. 12/094,551.
U.S. Office Action mailed Mar. 21, 2011 in parent, U.S. Appl. No. 12/094,551.
U.S. Office Action mailed Jul. 8, 2011 in parent, U.S. Appl. No. 12/094,551.

* cited by examiner

PACKAGE FOR LIGHT EMITTING ELEMENT ACCOMMODATION CONTAINING A SUBSTRATE AND A FRAME BODY, THE FRAME BODY CONTAINING ALUMINA AND BARIUM

RELATED APPLICATIONS

This application is a divisional of U.S. patent application Ser. No. 12/094,551, filed May 21, 2008, which is the National Phase of PCT/JP2006/323233 filed Nov. 21, 2006, which claims benefit of Japanese Patent Application No. 2005-335599 filed Nov. 21, 2005, the entire contents of each of which are incorporated herein by reference.

BACKGROUND OF THE INVENTION

1. Field of the Invention

The present invention relates to a light reflecting material, a package for a light emitting element accommodation, light emitting device and a method of manufacturing package for a light emitting element accommodation.

2. Related Art

In the past, a package having a substrate of ceramic has been used as a light emitting element package for storing a light element of a light emitting diode (LED), a semiconductor laser diode (LD) etc.

A conventional package having a substrate of ceramic comprises a substrate mounting a light emitting element and a frame body which is provided on the substrate and has a penetration hole. A power supply conductor for flowing current through the emitting element from the outside is provided at the substrate, this power supply conductor and the emitting element are connected by a bonding wire electrically. Then, the emitting element which is supplied with current from the outside through the power supply conductor, the bonding wire etc. emits light and the light emitted from the emitting element radiates to the outside directly or to the outside after reflected by an round inner surface of the penetration hole of the frame body. Thus, a shape and a composition of the round inner surface of the penetration hole of the frame body greatly influence an emitting efficiency of the emitting device mounting the emitting element.

Metals which have a relatively high reflectance are known as materials for the light reflection for the frame body of this kind of the emitting device. Material of ceramic etc. which is adjusted in the thermal expansion coefficient to the substrate and is plated with the metal is also known as the other material for reflecting (for example, see the patent document 1). Ag is known as the plating material having a relatively high reflectance, in the case of using Ag as the plating material although the reflectance is about 90% of the barium sulfate at the light of the wavelength of about 460 nm, the reflectance is low at the light of the wavelength of not more than about 460 nm and the reflectance is 77% at the average of the range from 250 nm to 800 nm.

Furthermore, the package for the light emitting element accommodation consists of the alumina which forming the reflecting wall surrounding the light emitting element and be integrated with the substrate is also proposed. This light reflecting material consists of alumina whose average particle diameter after sintering is 4 μm.

Patent Document 1: JP-A-2004-228531

However, if using the metal as the light reflecting material and connecting it to a substrate like ceramic which has a different thermal expansion coefficient, a bend of the substrate and an exfoliation of the frame body are occurred because their thermal expansion coefficients are not fitting.

If using the frame body whose base material is ceramic like Patent Document 1, the bend of the substructure and the exfoliation of the frame body are controlled. However, the improvement of the light reflectance is limited even if it is plated with the metal, and the manufacturing cost increases because the process of plating generates.

Furthermore, said sintered alumina can not get a sufficient reflectance and the reflectance is less than the metal plating using Ag at a predetermined wavelength region.

The present invention has been made in view of the above matter, and has its object to provide a light reflecting material, a package for a light emitting element accommodation, a light emitting device and a method of manufacturing a package for a light emitting element accommodation which increases a reflectance without plating metal onto ceramic.

SUMMARY OF THE INVENTION

According to the present invention, there is provided a light reflecting material containing alumina whose average particle diameter after sintering is not more than 2.5 μm at not less than 74.6 mass %.

In the above light reflecting material, it is preferable that the light reflecting material contains a barium element.

In the above light reflecting material, it is preferable that the light reflecting material contains the barium element at 0.698 mass %-22.4 mass %.

According to the present invention, there is provided a package for a light emitting element accommodation comprising:

a substrate comprising of ceramic; and a frame body which is formed on an upper surface of the substrate and contains a light reflecting material including alumina whose average particle diameter after sintering is not more than 2.5 μm at not less than 74.6 mass %.

In the above package for a light emitting element accommodation, it is preferable that the frame body contains a barium element.

In the above package for a light emitting element accommodation, it is preferable that the frame body contains the barium element at 0.698 mass %-22.4 mass %.

In the above package for a light emitting element accommodation, it is preferable that the substrate has a conductor mounted portion which mounts a light emitting element on an upper surface.

According to the present invention, there is provided a light emitting device comprising:

a substrate which has a conductor mounted portion mounting a light emitting element on an upper surface and comprises of ceramic;

a frame body which is formed on an upper surface of the substrate for surrounding the conductor mounted portion and contains a light reflecting material including alumina whose average particle diameter after sintering is not more than 2.5 μm at not less than 74.6 mass %; and an emitting element mounted on the conductor mounted portion of the substrate.

In the above light emitting device, it is preferable that the frame body contains a barium element.

In the above light emitting device, it is preferable that the frame body contains a barium element at 0.698 mass %-22.4 mass %.

According to the present invention, there is provided a method of manufacturing a package for a light emitting element accommodation wherein the package comprises a substrate comprising of ceramic and a frame body formed on an upper surface of the substrate, comprising:

making a raw powder including an alumina particle;

making a frame shaped object by shaping the raw powder; and obtaining the frame body including alumina whose average particle diameter after sintering is not more than 2.5 μm at not less than 74.6 mass % by sintering the frame shaped object.

In the above light emitting device, it is preferable that obtaining the frame body containing a barium element.

In the above light emitting device, it is preferable that obtaining the frame body containing the barium element at 0.698 mass %-22.4 mass %.

In the above light emitting device, it is preferable that obtaining the frame body at a sintering temperature of 1350 degrees C.-1650 degrees C.

In the above light emitting device, it is preferable that the raw powder contains barium carbonate.

In the above light emitting device, it is preferable that making the frame shaped object by pressing the raw powder in a mold.

In the above light emitting device, it is preferable that making the frame shaped object by punching a green sheet at a predetermined shape after making the green sheet from the raw powder.

Effects of the Invention

According to the present invention, it is possible to increase a reflectance without plating metal onto ceramic.

Figure 1:
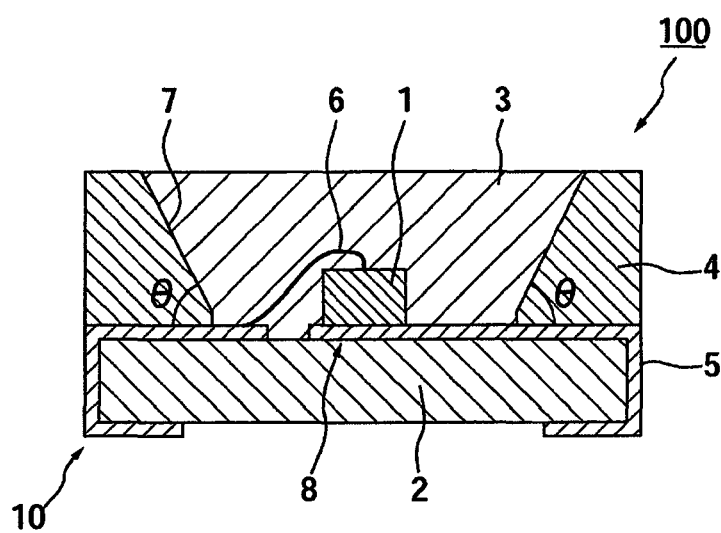
FIG. 1 is a perpendicular cross sectional view of the emitting device to show one embodiment of the invention.

| [Reference Numerals] | |
|---|---|
| 1 | emitting element |
| 2 | substrate |
| 3 | sealing member |
| 4 | frame body |
| 5 | power supply conductor |
| 6 | bonding wire |
| 7 | round inner surface |
| 8 | conductor mounted portion |
| 10 | package for emitting element accommodation |
| 100 | emitting device |
| θ | angle of inclination |

DETAILED DESCRIPTION OF THE PREFERRED EMBODIMENTS

Best Mode for Carrying Out the Invention

FIG. 1 is a perpendicular cross sectional view of the emitting device to show one embodiment of the invention.

As showing in FIG. 1, the package for the emitting element accommodation 10 comprises: the substrate 2 comprising of ceramic; and the frame body 4 whose round inner surface 7 of the penetration hole is formed on the round outer portion of the upper surface of the substrate 2 as the penetration hole expands to outside (upside in FIG. 1). The emitting device 100 comprises: the package for an emitting element accommodation 10; the emitting element 1 mounted on the package for an emitting element accommodation 10; and the sealing member 3 which seals the emitting element 1.

The emitting element 1 is mounted and fixed on the conductor mounted portion 8 which has conductivity and the emitting element 1 is supplied with current from outside through the power supply conductor 5, the bonding wire 6 and the conductor mounted portion 8. The emitting element 1 of this embodiment is, for example, an LED element of GaN system material and emits blue light.

The above substrate 2 is formed like a plate and, for example, is an almost circle shape, a rectangle, a square etc.

The above substrate 2 can use ceramic which is, for example, aluminum oxide sintering body (alumina ceramic), aluminum nitride sintering body, mullite sintering body, glass ceramic etc., and various resin.

The method of manufacturing the above substrate 2 is not limited in particular. In case of using ceramic, the green sheet method can be used. The green sheet method comprises: making slurry by adding an adequate organic binder, a solvent etc. to the above raw powder and mixing these; obtaining the green sheet by shaping this slurry into sheet shaped by the doctor blade method, calendar roll method etc.; and sintering the green sheet at the high temperature (about 1600 degree C.) after that. Also, the powder shaping method etc. which sintering after filling the above raw powder into the shaping machine can be used. In this embodiment, the green sheet method is preferable in conjunction with the substrate 2 shaping like a plate.

The above power supply conductor 5 consists of the metal which is, for example, W, Mo, Cu, Ag etc. and it can be deposited with Ni of 1-10 μm and Au of 0.03-3 μm on Ni for easy electrical connection. In this embodiment, the power supply conductor 5 extends to the edge portion on the upper surface of the substrate 2 and be lead to the lower surface of the substrate 2 through the side portion of the substrate 2.

In case of the mounted portion of the emitting element 1 is the conductor mounted portion 8 which is made of the conductor like FIG. 1, the conductor mounted portion 8 and the power supply conductor 5 are deposited on the predetermined position of the substrate 2 by applying and printing the metal paste to ceramic or the green sheet which become the substrate 2 by the screen printing method preliminarily. The metal paste is obtained by adding an adequate organic solvent and flux to the metal powder of, for example, W, Mo, Cu, Ag, Au etc. and mixing these. After drying it is manufactured by sintering.

The sealing member 3 consists of a transparent resin which is, for example, silicone system, epoxy system etc. and fills the penetration hole of the frame body 4. Also, the sealing member 3 is formed of a transparent glass. The emitting element 1, bonding wire 6 etc. are protected by the sealing member 3.

The frame body 4 has a shape which is a pillar object like a column, a quadratic prism etc. for example, and has the penetration hole in the inside, and surrounds the conductor mounted portion 8. The round inner surface 7 of the above penetration hole is shaped as expanding to the outside for emitting light from the emitting element 1 to the outside efficiently by reflecting the light to the upper side of the package at the round inner surface 7 thoroughly. The angle of inclination θ of the round inner surface 7 shown in FIG. 1 can be selected suitably according to the use of the emitting device 100. In case of using the emitting device 100 for an indoor illumination and a liquid crystal backlight, it is preferable that the spread of the light distribution is big by shaping the angle of inclination θ into a relatively small angle, for example, like 45°. In case of using the emitting device 100 for a spot light and a head light of a vehicle, it is preferable that the spread of the light distribution is small by shaping the angle of inclination θ into a relatively big angle, for example, like 70°. It is preferable that the composition of the frame body 4 contains at least alumina and a barium element.

The frame body 4 of this embodiment has a bonded state as a whole, the state is caused by alumina particles of the raw material which have not melted completely and keep particle shape. The state is also caused by particles which have grown and a particle diameter become big. Thus, it is possible that the particle diameter of the particle shape is measured.

In this embodiment, the average particle diameter of the light reflecting material after sintering alumina is defined by the average value of the alumina particle diameter. The alumina particle diameter having the state which has not melted completely and keeps the particle shape is measured by seeing a surface of the light reflecting material or the round inner surface 7 of the frame body 4 with the electric microscope.

In this embodiment, the mass % of alumina included in the light reflecting material is the percentage of mass per the all sintering body of mass of alumina sintered like this.

It is preferable that the reflectance at the light from the emitting element 1 is higher because the frame body 4 reflects the light from the emitting element 1 by the round inner surface 7. It is also preferable that the frame body 4 has the predetermined strength because the frame body 4 composes the package for the light emitting element accommodation 10. Concerning the light reflecting material used in the frame body 4, a plurality of samples which have a variety of alumina particle after sintering are made and these reflectance and strength are measured. Furthermore, a plurality of samples which have alumina mixed barium etc. are made and these reflectance and strength are measured.

As this result, in case of sintering at alumina 100%, it is discovered that the average particle is bigger as a temperature is higher. Also, in case of not containing barium, it is preferable that a sintering temperature is 1250-1600 degree C., 1300-1570 degree C. is more preferable. Then, it is discovered that the average diameter is small if barium carbonate is mixed. Thus, it is discovered that this is preferable for securing the reflectance with suppressing an increase of an average particle diameter of alumina because a barium element which is contained in the sintered object is not colored and does not absorb a light.

Although the reflectance is 81% at 3.5 μm of the average particle diameter of alumina after sintering, the reflectance of 91% is obtained at 2.5 μm of the average particle diameter, and the reflectance increases progressively than before. The reflectance used in here is the average value in the light wavelength of 250 nm-800 nm and the relative value in case that the reflectance of barium sulfate is 100%. Thus, it is possible to obtain the higher reflectance than conventional alumina if the average particle diameter is not more than 2.5 μm. The reflectance of 95% is obtained at 1.3 μm of the average particle diameter and it is preferable that the average particle diameter is not more than 1.3 μm for more increasing the reflectance. Furthermore, the reflectance of 102% is obtained at 1.0 μm of the average particle diameter and it is more preferable that the average particle diameter is not more than 1.0 μm because of exceeding the reflectance of barium sulfate.

If sintered alumina is not less than 74.6 mass %, it is preferable as a object applying for the package for the light emitting element accommodation because it is possible to secure a transverse rupture strength of not less than 13.6 MPa. Also, if sintered alumina is not less than 87.5 mass %, it is more preferable because it is possible to secure a transverse rupture strength of not less than 90 MPa. Meanwhile, in case of using the light reflecting material for a device etc. which is not required a strength, it is no problem if sintered alumina is 56.0 mass % for example.

For the above, from a point of view of securing predetermined strength, it is preferable that the mass % of barium carbonate before sintering is 1.0%-30%, namely the mass % of the barium element after sintering is 0.698%-22.4%. It is more preferable that the mass % of barium carbonate before sintering is 5.0%-15%, namely the mass % of the barium element after sintering is 3.52%-10.8%.

Meanwhile, although a configuration of the barium element contained in a sintered object is arbitrary, containing in the frame composition with the configuration of the barium oxide is preferable.

Also, in the range which does not vitiate the condition of containing the above alumina, barium element in the frame composition, the other elements or compounds can be present. As these other elements or compounds, the elements of magnesium, silicon, titanium, calcium, zirconium, tin etc. or these compounds are illustrated.

The method of manufacturing the frame body 4 is not limited in particular and although it is possible to manufacture it by the above green sheet method or powder shaping method, the powder shaping method is preferable from the point of view of manufacturing the frame body which has an exact shape.

The powder of ceramic raw material used in the frame body 4 is made by blending of alumina, barium compound which satisfies the quantity of alumina and the quantity of the barium element composing the composition of the frame body 4, and the other powder of ceramic raw material or the binder resin etc. as necessary.

As the barium compound is not limited in particular and although barium hydride, barium fluoride, barium chloride, barium hydroxide, barium oxide, barium chlorate, barium sulfate, barium nitrate, barium carbonate etc. are illustrated, barium carbonate is preferable from the point of view of obtaining good luminous efficiency.

The method of manufacturing the reflecting material used in the frame body 4 by the powder shaping method is explained below seeing the explanation drawing for processes of FIG. 2.

Figure 2:
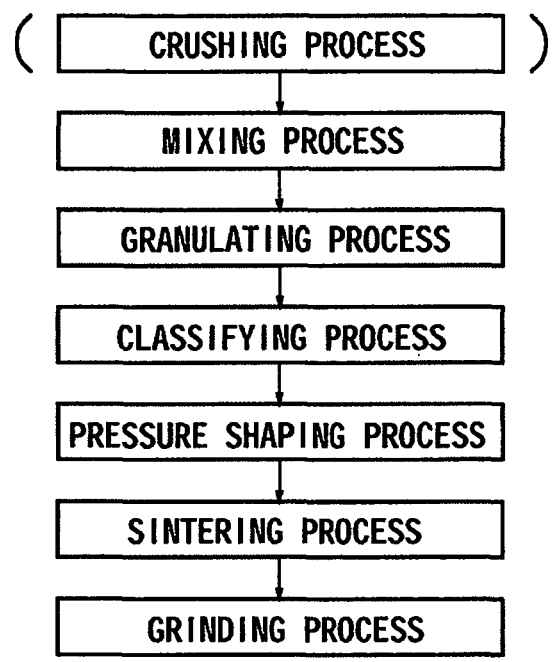
FIG. 2 is a process explanation chart of the method of manufacturing the light reflecting material.

As shown in FIG. 2, firstly, the raw materials are crushed to the predetermined size and the raw powder is made in case that it is necessary to crush the raw materials (crushing process), after this, the slurry is obtained by adding the raw powder to the resin and the water and mixing these (mixing process). For example, a ball mill is used in crushing the raw materials and mixing the raw powder. Meanwhile the crushing process is omissible. It is preferable that the numeric value of the average particle diameter of alumina particle mixed at the mixing process is smaller than the numeric value of the average particle diameter of alumina particle in the sintered object obtained after sintering.

Alumina and barium carbonate are used as the raw material mixed at mixing process and the binder of acrylic, PVA (polyvinyl alcohol) etc., for example, as the resin. It is preferable that the content of the resin in the solid of the slurry is 0.5 mass %-5.0 mass %, and 1.5 mass %-3.5 mass % is more preferable. If the amount of the resin in the solid is rich, particles are subjected to coarse structure and fine structure on account of the particles are solid at the time of the granulation of the raw powder. If the amount of the resin is thin, the strength of the powder shaped product becomes weak. For example, stearic acid emulsion is used as a lubricant and it is preferable that the content in the solid is 0.05 mass %-0.5 mass %, 0.1 mass %-0.3 mass % is more preferable. The slurry obtained by adding water is preferable 30 volume %-70 volume % and is more preferable 40 volume %-50 volume %.

After that, the mixed particles of the raw powder is granulated to the size for shaping by the powder shaped machine (granulating process). For example, a spray dryer is used for granulating particles. The granulated particle diameter is preferable 25 μm-200 μm and more preferable 30 μm-150 μm. Then, the granulated powder is classified by the sieve etc. (classifying process). The filling performance to a metallic mold is aggravated if the particles are too big at the time of shaping powder, the particles move into a clearance of the metallic mold and a burr is easy to arise if the particles are too fine at the time of shaping powder.

Figure 3:
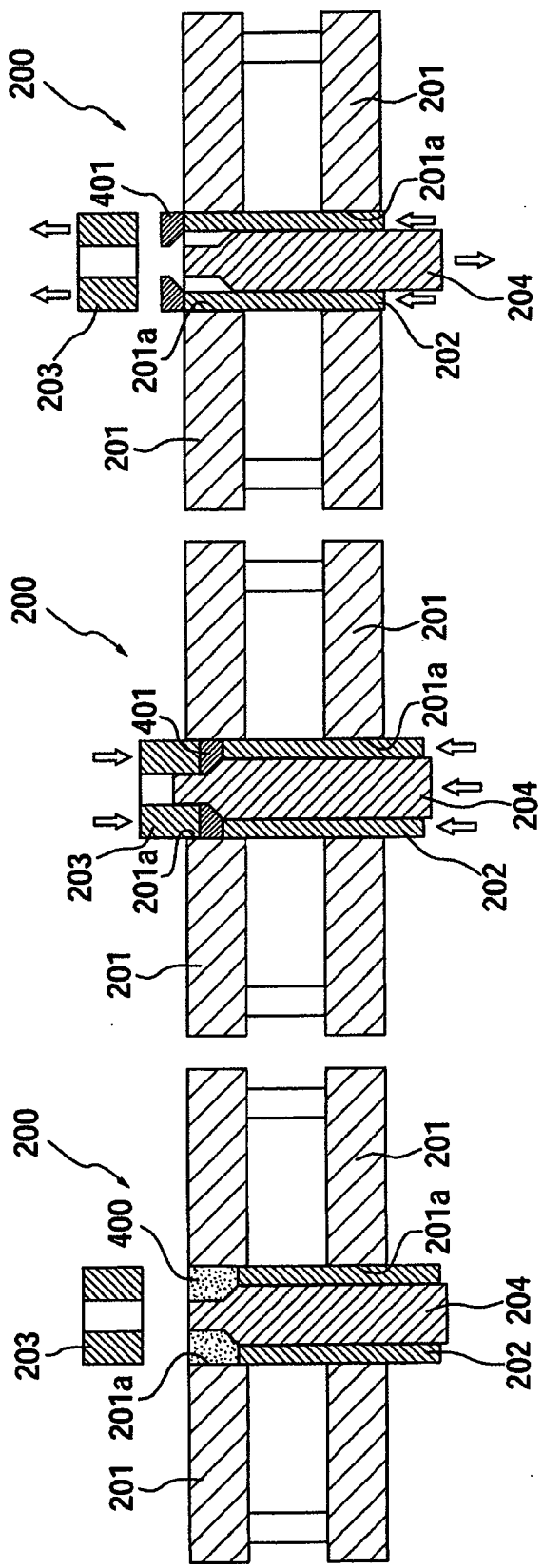
FIG. 3A is an explanation view in pressing and molding the raw powder and the drawing shows the raw powder which is filled into the upside and downside mold.
FIG. 3B is an explanation view in pressing and molding the raw powder and the drawing shows the raw powder which is pressed by the upside and downside mold.
FIG. 3C is an explanation view in pressing and molding the raw powder and the drawing shows the frame shaped object removed from the upside and downside mold.

Next, the granulated raw powder is filled into the metallic mold and shaped by pressing at normal temperature (pressure shaping process). FIG. 3A, FIG. 3B and FIG. 3C are the explanation view for pressure shaping of the raw powder. As shown in FIG. 3A-FIG. 3C, the pressure shaping machine 200 has an up-and-down pair of a die set 201 and each die set 201 is formed the hole 201a corresponding to the shape of planar view of the frame body 4. The pressure shaping machine 200 also has a downside mold 202 which passes through the hole 201a of the downside die set 201 and is movable in an upward-and-downward direction and an upside mold 203 which is inserted and removed from the hole 201a of the upside die set 201. The downside mold 202 has a section formed as corresponding to an upper surface of the frame body 4, the upside mold 203 has a section formed as corresponding to an under surface. Furthermore, the pressure shaping machine 200 has a core 204 which is put in the inside of the downside mold 202 and is movable in an upward-and-downward direction. The top edge of the core 204 is formed as corresponding to the round inner surface 7 of the frame body 4.

Then, as shown in FIG. 3A, the downside mold 202 and the core 204 are set as these top edges make the upper surface and the round inner surface 7 of the frame body 4 and the hole 201a of the upside die set 201 makes the round outer surface of the frame body 4. Then, the raw powder 400 is filled in the hole 201a of the upside die set 201. After this state, as shown in FIG. 3B, the raw powder 400 is pressed by going down the upside mold 203 and going up the downside mold 202 and the core 204. At this time, the pressure of applying to the powder is preferable 0.5 t/cm$^2$-2.0 t/cm$^2$ and more preferable 0.7 t/cm$^2$-1.5 t/cm$^2$. Next, as shown in FIG. 3C, the object shaped frame body 401 is removed from the upside die set 201 by going down the core 204, going up the upside mold 203 and going up the downside mold 202.

The frame body 4 is obtained by sintering the object shaped the frame body which is shaped in this way in a sintering furnace (sintering process). The temperature condition of sintering is preferable 1350-1650 degree C. For example, the sinter is done by rising temperature for ten hours, keeping temperature at a target temperature for five hours and falling temperature for eight hours. After the sinter, it is grinded by using, for example, barrel finishing machine for removing the burr (grinding process). The frame body 4 is manufactured like this.

The method of manufacturing the reflecting material used in the frame body 4 by the green sheet method is explained below seeing the explanation drawing for processes of FIG. 4.

Figure 4:
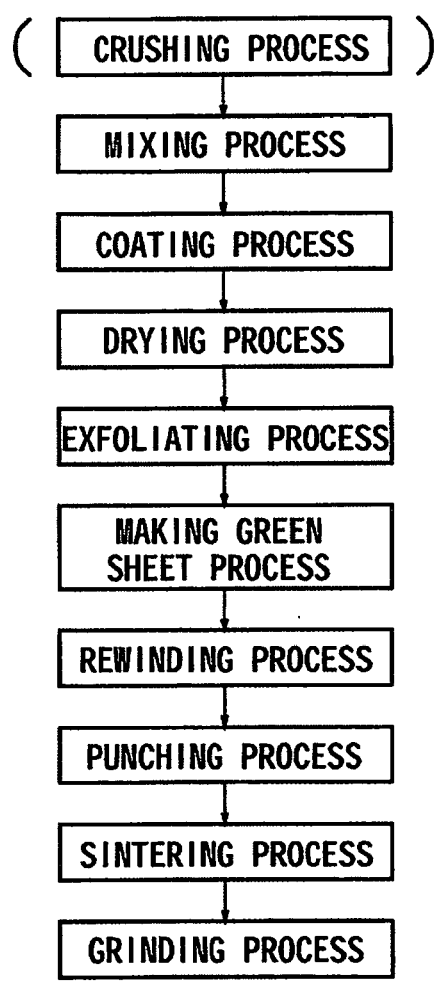
FIG. 4 is an explanation chart for process of the manufacturing method for the reflecting material using the green sheet method.

As shown in FIG. 4, the raw materials are crushed to the predetermined size and the raw powder is made in case that it is necessary to crush the raw materials (crushing process), after this, the slurry is obtained by adding the raw powder to the solvent, the resin, the dispersant, the plasticizer etc. and kneading these (mixing process). For example, the ball mill is used for crushing the raw materials and kneading the raw powder.

Alumina and barium carbonate are used as the crushed raw material and the binder of acrylic, PVA (polyvinyl alcohol) etc., for example, as the resin. It is preferable that the content of the resin in the solid of the slurry is 4.0 mass %-20 mass %, and 6.0 mass %-8.0 mass % is more preferable. Various activators are used as the dispersant and it is preferable that the content in the solid is 0.1 mass %-1.0 mass %, and 0.3 mass %-0.5 mass % is more preferable. For example, DOP (dioctyl phthalate), DBP (dibutyl phthalate) etc. are used as the plasticizer and it is preferable that the content in the solid is 3.0 mass %-15 mass %, and 4.0 mass %-6.0 mass % is more preferable. For example, toluene is used as the solvent and it is preferable that total solid is 70 mass %-80 mass %. A viscosity of the slurry is preferable 3000 cps-30000 cps, more preferable 15000 cps-20000 cps.

Figure 5:
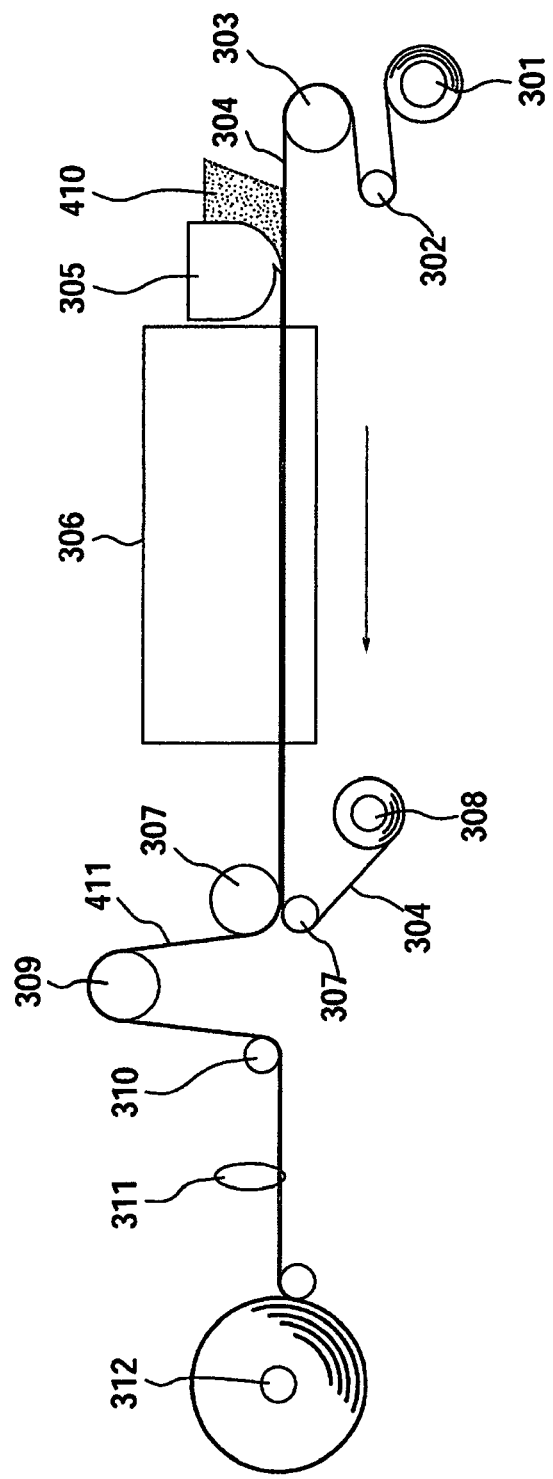
FIG. 5 is an explanation diagram in making the green sheet from the raw powder.

After this, the obtained slurry is poured into a film applied release agent (coating process), the solvent is evaporated by drying (drying process). FIG. 5 is the explanation diagram in making the green sheet from the raw powder. Concretely, as shown in FIG. 5, the film 304 applied the release agent is sent from the sending roll 301 through the tension roll 302, the fixed roll 303 etc., the slurry 410 is coated to film 304 by using the doctor blade 305. Then, the coated slurry 410 is dried by using hot air in the dry furnace. At this time, 80-130 degree C. is preferable and 100-120 degree C. is more preferable as the drying temperature. 0.2 m/min-2.0 m/min is preferable as the drying speed.

After this, it is exfoliated from the film (exfoliating process), the green sheet is made (making green sheet process).

Concretely, as shown in FIG. 5, the green sheet 411 is separated by the film 304 is sent to the side of the wind-up roll 308 and the green sheet 411 is sent to the side of the dancer roll 309 after passing the separate roll 307. The separated green sheet 411 is rewound by the wind-up roll 312 after passing the fixed roll 310 and cut by using the cutting blade 411 to be the predetermined size at the width direction (rewinding process).

The object shaped the frame body is obtained by punching this green sheet by the press shaping machine to correspond to the shape of the frame body 4 (punching process). Next, the frame body 4 is obtained by sintering the object shaped the frame body in the sintering furnace (sintering process). The condition of the sintering is preferable 1400-1700 degree C. For example, the sinter is done by rising temperature for ten hours, keeping temperature at a target temperature for five hours and falling temperature for eight hours. After the sinter, it is grinded by using, for example, barrel finishing machine (grinding process). The frame body 4 is manufactured like this.

The package for the light emitting element accommodation 10 of this embodiment is manufactured by connecting the substrate 2 which has the power supply conductor 5 and the frame body 4.

In the connection between the substrate 2 and the frame body 4, the substrate 2 and the frame body 4 are fixed by a brazing material of Ag—Cu etc. which has a melting point of 700-900 degree C., and by a thermosetting epoxy resin, various resin adhesives of silicone resin etc., a glass etc.

As shown in FIG. 1, the emitting device 100 of this embodiment is manufactured by fixing the light emitting element 1 to the conductor mounted portion 8 and connecting the light emitting element 1 and the power supply conductor 5.

Experimental Example 1

In FIG. 1, the conductive paste was applied the place of the wiring conductor of the ceramic plate becoming the substrate 2 and it was sintered after drying. Concretely, the substrate 2 having the power supply conductor 5 was made by using the alumina substrate of purity 99% of Hokuriku-Ceramic as the substrate 2, applying the conductive paste of the grade-name "5164" made of Du-Pont to this, drying it at the temperature of 150 degree C. for ten minutes and keeping the highest temperature 850 degree C. for ten minutes.

Figure 6:
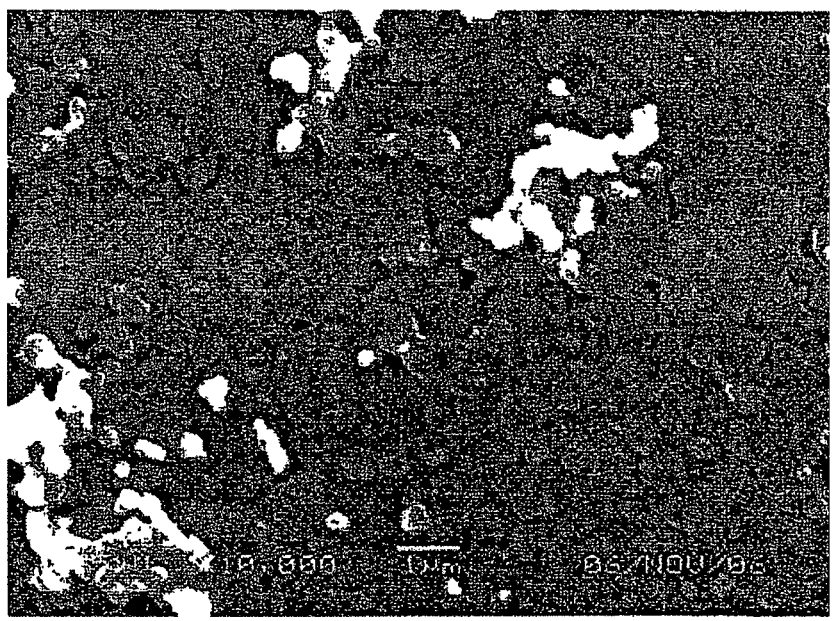
FIG. 6 is a photograph showing the surface structure of the sample J with the electron microscope in one experimental example.

Next, the slurry of 50 volume % was obtained by mixing 90 parts by weight of high purity alumina "AES-12" (purity 99.5%) of Sumitomo-Chemical, 10 parts by weight of high purity barium carbonate "LSR" of Nippon-Chemical, 3 parts by weight of binder "NCB-156" of Dainippon-Ink, and 0.1 parts by weight of Cyukyo-Oils-and-Fats, adding water to these and mixing these in the ball mill. This slurry consisted of 80 parts by mass of alumina of the average particle diameter 0.4 μm, 10 parts by mass of barium carbonate and 15 parts by mass of resin binder (composition of olefin wax 30 and acrylic resin 70). After that, it was granulated by drying at the temperature condition of 110 degree C. and classified by the sieve of the mesh opening size of 25 μm and 150 μm. The average particle diameter of the obtained powder was 40 μm. After this, the powder was filled into the metallic mold for the frame body and the object shaped the frame body was obtained by giving the pressure of 1 t/cm2 at the room temperature by using the 10-ton press machine of Sanken-Seiki. Then, the frame body 4 was made of the object shaped the frame body by rising temperature for ten hours, keeping temperature at 1520 degree C. for five hours and falling temperature for eight hours. In this experimental example, the frame body 4 which was 7 mm-square in the planer view and had the penetration hole whose the smallest diameter portion was 3 mm and θ was 45 degrees was made. The average particle diameter of the remaining particle object of alumina of the obtained frame body 4 was 0.8 μm. Then, in the sample (Sample J in Table.1) which is shaped at the same condition without the shape for a property measurement, the reflectance is 102% and the transverse rupture is 170 MPa. The aspect observing the frame body 4 with the electric microscope is shown in FIG. 6.

After that, the package for the light emitting element accommodation 10 of the this example was obtained by connecting the substrate 2 placing the power supply conductor 5 and the above frame body 4 at the temperature of 120 degree C. for thirty minutes using silicone resin "SW1720CV" of Toray-Dow.

Experimental Example 2

The material for light reflecting was made of the raw powder of the slurry which had alumina 100 parts by mass of the average particle diameter 0.1 μm and barium carbonate 0 parts by mass at the sintering temperature 1350 degree C. in the same way of Experimental Example 1. The average particle diameter of the remaining particle object of alumina of the obtained material for light reflection was 0.6 μm, the reflectance was 102% and the transverse rupture was 145 MPa (Sample A in Table.1).

Experimental Example 3

The material for light reflecting was made of the raw powder of the slurry which had alumina 100 parts by mass of the average particle diameter 0.4 μm and barium carbonate 0 parts by mass by rising temperature for ten hours, keeping 1520 degree C. for five hours and falling temperature for eight hours. The average particle diameter of the remaining particle object of alumina of the obtained material for light reflection was 1.2 μm, the reflectance was 91% and the transverse rupture was 210 MPa (Sample B in Table.1).

Comparative Example 1

Figure 7:
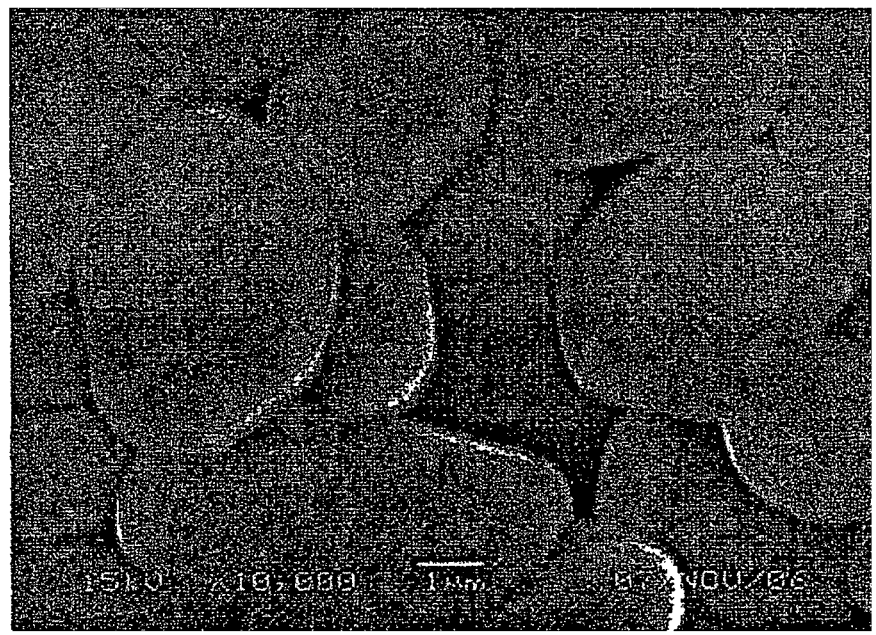
FIG. 7 is a photograph showing the surface structure of the sample C with the electron microscope in one comparative example.

The material for light reflecting was made of the raw powder of the slurry which had alumina 100 parts by mass of the average particle diameter 0.4 μm and barium carbonate 0 parts by mass by rising temperature for ten hours, keeping 1700 degree C. for ten hours and falling temperature for eight hours. The average particle diameter of the remaining particle object of alumina of the obtained material for light reflection was 3.5 μm, the reflectance was 81% and the transverse rupture was 360 MPa (Sample C in Table.1). The aspect observing this Sample C with the electric microscope is shown in FIG. 7.

Experimental Example 4

The material for light reflecting was made of the raw powder of the shiny which had alumina 100 parts by mass of the average particle diameter 0.4 μm and barium carbonate 0 parts by mass by rising temperature for ten hours, keeping 1650 degree C. for ten hours and falling temperature for eight hours. The average particle diameter of the remaining particle object of alumina of the obtained material for light reflection was 2.5 μm, the reflectance was 91% and the transverse rupture was 220 MPa (Sample D in Table.1).

Experimental Example 5

The material for light reflecting was made of the raw powder of the slurry which had alumina 99 parts by mass of the average particle diameter 0.4 μm and barium carbonate 1 parts by mass at the sintering temperature 1350 degree C. in the same way of Experimental Example 1. The average particle diameter of the remaining particle object of alumina of the obtained material for light reflection was 0.4 μm, the reflectance was 102% and the transverse rupture was 125 MPa (Sample E in Table.1).

Experimental Example 6

The material for light reflecting was made of the raw powder of the slurry which had alumina 99 parts by mass of the average particle diameter 0.4 μm and barium carbonate 1 parts by mass at the sintering temperature 1570 degree C. in the same way of Experimental Example 1. The average particle diameter of the remaining particle object of alumina of the obtained material for light reflection was 1.1 μm, the reflectance was 99% and the transverse rupture was 190 MPa (Sample F in Table.1).

Experimental Example 6

The material for light reflecting was made of the raw powder of the slurry which had alumina 95 parts by mass of the average particle diameter 0.4 μm and barium carbonate 5 parts by mass at the sintering temperature 1350 degree C. in the same way of Experimental Example 1. The average particle diameter of the remaining particle object of alumina of the obtained material for light reflection was 0.6 μm, the reflectance was 102% and the transverse rupture was 123 MPa (Sample G in Table.1).

Experimental Example 7

The material for light reflecting was made of the raw powder of the slurry which had alumina 95 parts by mass of the average particle diameter 0.4 μm and barium carbonate 5 parts by mass at the sintering temperature 1570 degree C. in the same way of Experimental Example 1. The average particle diameter of the remaining particle object of alumina of the obtained material for light reflection was 0.9 μm, the reflectance was 101% and the transverse rupture was 190 MPa (Sample H in Table.1).

Experimental Example 8

The material for light reflecting was made of the raw powder of the slurry which had alumina 90 parts by mass of the average particle diameter 0.1 μm and barium carbonate 10 parts by mass at the sintering temperature 1350 degree C. in the same way of Experimental Example 1. The average particle diameter of the remaining particle object of alumina of the obtained material for light reflection was 0.4 μm, the reflectance was 103% and the transverse rupture was 105 MPa (Sample I in Table.1).

Experimental Example 9

The material for light reflecting was made of the raw powder of the slurry which had alumina 90 parts by mass of the average particle diameter 0.4 μm and barium carbonate 10 parts by mass at the sintering temperature 1570 degree C. in the same way of Experimental Example 1. The average particle diameter of the remaining particle object of alumina of the obtained material for light reflection was 1.3 μm, the reflectance was 95% and the transverse rupture was 230 MPa (Sample K in Table.1).

Experimental Example 10

The material for light reflecting was made of the raw powder of the slurry which had alumina 85 parts by mass of the average particle diameter 0.4 μm and barium carbonate 15 parts by mass at the sintering temperature 1570 degree C. in the same way of Experimental Example 1. The average particle diameter of the remaining particle object of alumina of the obtained material for light reflection was 0.8 μm, the reflectance was 103% and the transverse rupture was 90 MPa (Sample L in Table.1).

Experimental Example 11

The material for light reflecting was made of the raw powder of the slurry which had alumina 80 parts by mass of the average particle diameter 0.4 μm and barium carbonate 20 parts by mass at the sintering temperature 1570 degree C. in the same way of Experimental Example 1. The average particle diameter of the remaining particle object of alumina of the obtained material for light reflection was 0.8 μm, the reflectance was 102% and the transverse rupture was 70 MPa (Sample M in Table.1).

Experimental Example 12

The material for light reflecting was made of the raw powder of the slurry which had alumina 75 parts by mass of the average particle diameter 0.4 μm and barium carbonate 25 parts by mass at the sintering temperature 1570 degree C. in the same way of Experimental Example 1. The average particle diameter of the remaining particle object of alumina of the obtained material for light reflection was 0.8 μm, the reflectance was 102% and the transverse rupture was 36 MPa (Sample N in Table.1).

Experimental Example 13

The material for light reflecting was made of the raw powder of the slurry which had alumina 70 parts by mass of the average particle diameter 0.4 μm and barium carbonate 30 parts by mass at the sintering temperature 1350 degree C. in the same way of Experimental Example 1. The average particle diameter of the remaining particle object of alumina of the obtained material for light reflection was 0.9 μm, the reflectance was 102% and the transverse rupture was 13.6 MPa (Sample O in Table.1).

Experimental Example 14

The material for light reflecting was made of the raw powder of the slurry which had alumina 70 parts by mass of the average particle diameter 0.1 μm and barium carbonate 30 parts by mass at the sintering temperature 1350 degree C. in the same way of Experimental Example 1. The average particle diameter of the remaining particle object of alumina of the obtained material for light reflection was 1.0 μm, the reflectance was 102% and the transverse rupture was 17.9 MPa (Sample P in Table.1).

Experimental Example 15

The material for light reflecting was made of the raw powder of the slurry which had alumina 70 parts by mass of the average particle diameter 0.4 μm and barium carbonate 30 parts by mass at the sintering temperature 1570 degree C. in the same way of Experimental Example 1. The average particle diameter of the remaining particle object of alumina of the obtained material for light reflection was 1.1 μm, the reflectance was 100% and the transverse rupture was 20.2 MPa (Sample Q in Table.1).

Experimental Example 16

The material for light reflecting was made of the raw powder of the slurry which had alumina 50 parts by mass of the average particle diameter 0.4 μm and barium carbonate 50 parts by mass at the sintering temperature 1350 degree C. in the same way of Experimental Example 1. The average particle diameter of the remaining particle object of alumina of the obtained material for light reflection was 0.8 μm, the reflectance was 102% and the transverse rupture was 2.9 MPa (Sample R in Table.1).

Experimental Example 17

The material for light reflecting was made of the raw powder of the slurry which had alumina 50 parts by mass of the average particle diameter 0.1 μm and barium carbonate 50 parts by mass at the sintering temperature 1350 degree C. in the same way of Experimental Example 1. The average particle diameter of the remaining particle object of alumina of the obtained material for light reflection was 1.0 μm, the reflectance was 102% and the transverse rupture was 1.8 MPa (Sample S in Table.1).

Experimental Example 18

The material for light reflecting was made of the raw powder of the slurry which had alumina 50 parts by mass of the average particle diameter 0.4 μm and barium carbonate 50 parts by mass at the sintering temperature 1570 degree C. in the same way of Experimental Example 1. The average particle diameter of the remaining particle object of alumina of the obtained material for light reflection was 2.0 μm, the reflectance was 93% and the transverse rupture was 7.2 MPa (Sample T in Table.1).

Concerning the samples of the material for light reflection used in Experimental Example 1-18 and comparative Example 1, the compound composition, the sintering condition, the alumina diameter, the reflectance and the strength are shown in Table.1. Meanwhile, in Table.1, the reflectance of the sintered object is the average value in the light wavelength of 250 nm-800 nm and the relative value in case that the reflectance of barium sulfate is 100%. Concretely, the reflectance is measured by using the spectrophotometer of Hitachi (U-4000). At this time, the strength evaluation is done by the transverse rupture strength, "JIS R 1601 Testing method for flexural strength of fine ceramics" was used as the measuring method of the transverse rupture strength.

TABLE 1

| No. | ALUMINA QUANTITY (MASS %) | ALUMINA PARTICLE DIAMETER (μm) | SECOND CERAMIC MATERIAL QUANTITY (MASS %) | SECOND CERAMIC MATERIAL | SINTERING CONDITION TEMPERATURE (DEG C.) | SINTERING CONDITION TIME (Hour) | SINTERED OBJECT PARTICLE DIAMETER (μm) | SINTERED OBJECT REFLECTANCE (%) | SINTERED OBJECT STRENGTH (MPa) |
|---|---|---|---|---|---|---|---|---|---|
| A | 100 | 0.1 | 0 | $BaCO_3$ | 1350 | 5 | 0.6 | 102 | 145 |
| B | 100 | 0.4 | 0 | $BaCO_3$ | 1570 | 5 | 1.2 | 96 | 210 |
| C | 100 | 0.4 | 0 | $BaCO_3$ | 1700 | 10 | 3.5 | 81 | 360 |
| D | 100 | 0.4 | 0 | $BaCO_3$ | 1650 | 10 | 2.5 | 91 | 220 |
| E | 99 | 0.1 | 1 | $BaCO_3$ | 1350 | 5 | 0.4 | 102 | 125 |
| F | 99 | 0.4 | 1 | $BaCO_3$ | 1570 | 5 | 1.1 | 99 | 190 |
| G | 95 | 0.4 | 5 | $BaCO_3$ | 1350 | 5 | 0.6 | 102 | 123 |
| H | 95 | 0.4 | 5 | $BaCO_3$ | 1570 | 5 | 0.9 | 101 | 190 |
| I | 90 | 0.1 | 10 | $BaCO_3$ | 1350 | 5 | 0.4 | 103 | 105 |
| J | 90 | 0.4 | 10 | $BaCO_3$ | 1520 | 5 | 0.8 | 102 | 170 |
| K | 90 | 0.4 | 10 | $BaCO_3$ | 1570 | 5 | 1.3 | 95 | 230 |
| L | 85 | 0.4 | 15 | $BaCO_3$ | 1570 | 5 | 0.8 | 103 | 90 |
| M | 80 | 0.4 | 20 | $BaCO_3$ | 1570 | 5 | 0.8 | 102 | 70 |
| N | 75 | 0.4 | 25 | $BaCO_3$ | 1570 | 5 | 0.8 | 102 | 36 |
| O | 70 | 0.4 | 30 | $BaCO_3$ | 1350 | 5 | 0.9 | 102 | 13.6 |
| P | 70 | 0.1 | 30 | $BaCO_3$ | 1350 | 5 | 1.0 | 102 | 17.9 |
| Q | 70 | 0.4 | 30 | $BaCO_3$ | 1570 | 5 | 1.1 | 100 | 20.2 |
| R | 50 | 0.4 | 50 | $BaCO_3$ | 1350 | 5 | 0.8 | 102 | 2.9 |
| S | 50 | 0.1 | 50 | $BaCO_3$ | 1350 | 5 | 1.0 | 102 | 1.8 |
| T | 50 | 0.4 | 50 | $BaCO_3$ | 1570 | 5 | 2.0 | 93 | 7.2 |

As mentioned above, in Table.1, the samples A-D are the sintered object obtained by alumina 100%. Meanwhile, the 100% in Table.1 is defined by containing 100% alumina. Also, the samples E-T are the sintered object obtained by mixing barium carbonate to alumina.

Also, Table.2 is the table which arranges the data of the reflectance of the obtained samples A-T from upside to downside in the order of the content of sintered alumina from highest and from left side to right side in the order of the average diameter of alumina after sintering from smallest. In Table.2, the content of the sintered alumina and barium is shown. As shown in Table.2, the reflectance tends to be higher as the average particle diameter is smaller.

TABLE 2

| SINTERED OBJECT | | AVERAGE PARTICLE DIAMETER (μm) | | | | | | | | | | |
|---|---|---|---|---|---|---|---|---|---|---|---|---|
| ALUMINA (MASS %) | BARIUM ELEMENT (MASS %) | 0.4 | 0.6 | 0.8 | 0.9 | 1.0 | 1.1 | 1.2 | 1.3 | 2.0 | 2.5 | 3.5 |
| 99.5 | 0 |  | A 102% |  |  |  |  | B 96% |  |  | D 91% | C 81% |
| 98.7 | 0.698 | E 102% |  |  |  |  | F 99% |  |  |  |  |  |
| 95.6 | 3.52 |  | G 102% |  | H 101% |  |  |  |  |  |  |  |
| 91.6 | 7.12 | I 103% |  |  | J 102% |  |  |  |  | K 95% |  |  |
| 87.5 | 10.8 |  |  |  | L 103% |  |  |  |  |  |  |  |
| 83.3 | 14.6 |  |  |  | M 102% |  |  |  |  |  |  |  |
| 79.0 | 18.4 |  |  |  | N 102% |  |  |  |  |  |  |  |
| 74.6 | 22.4 |  |  |  |  | O 102% | P 102% | Q 100% |  |  |  |  |
| 56.0 | 39.2 |  |  | R 102% |  | S 102% |  |  |  | T 93% |  |  |

At this time, the photograph observing the surface structure of the sample J with the electron microscope is shown in FIG. 6 as an experimental example and the photograph observing the surface structure of the sample C with the electron microscope is shown in FIG. 7 as a comparative example.

Figure 8:
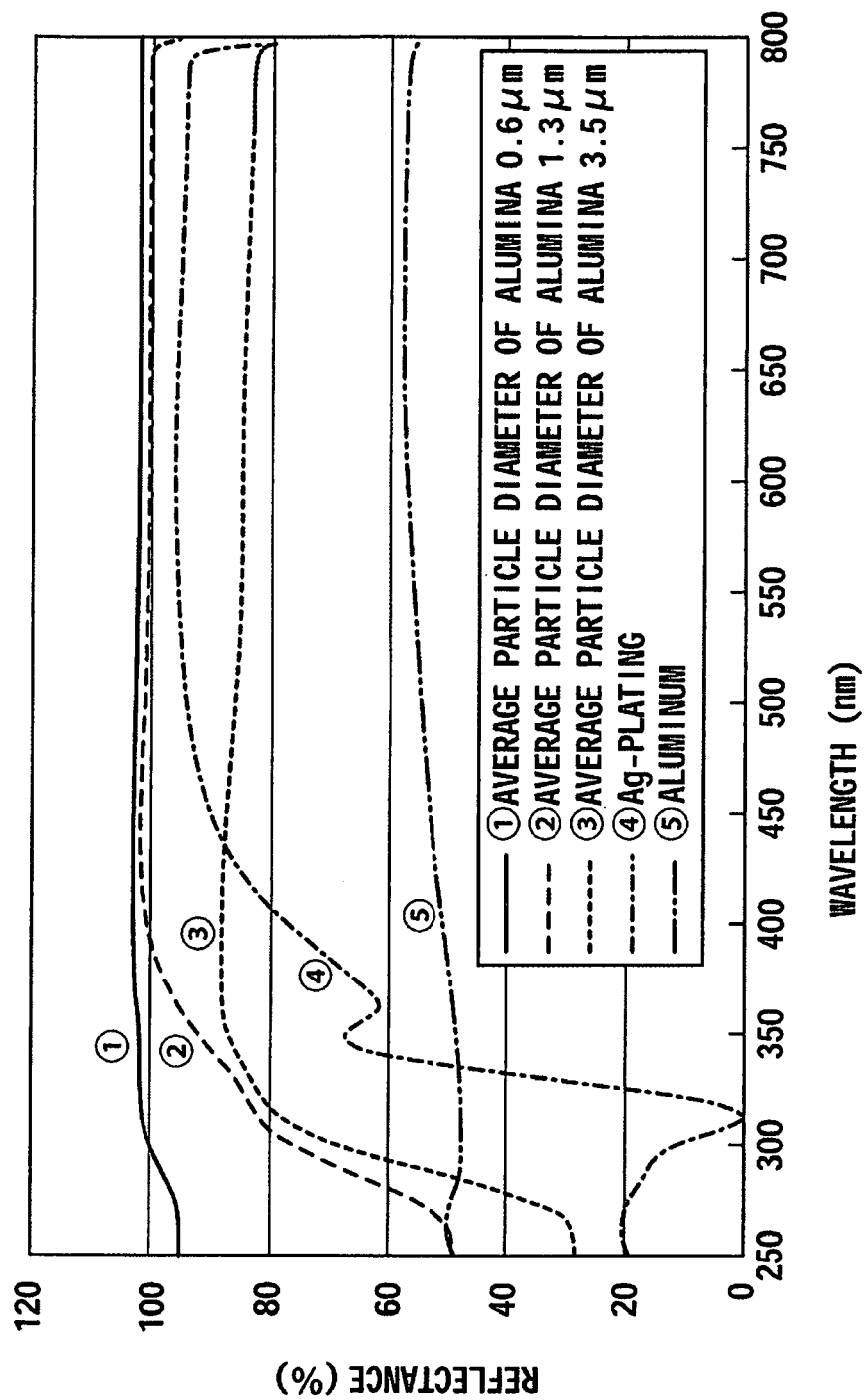
FIG. 8 is a graph which shows the relationship between the wavelength of the incident light and the reflectance concerning the light reflecting material of the average particle diameter of 0.6 μm, 1.3 μm and 3.5 μm, the light reflecting material consisting of alumina and the light reflecting material whose ceramic is plated with Ag.

FIG. 8 is the graph which shows the relationship between the wavelength of the incident light and the reflectance concerning the light reflecting material of the average particle diameter of 0.6 μm, 1.4 μm and 3.5 μm, the light reflecting material consisting of alumina and the light reflecting material whose ceramic is plated with Ag. As shown in FIG. 8, the reflectance is higher as the average particle diameter of alumina is smaller and it exceeds the reflectance of the material for light reflection using Ag-plated in all wavelength region.

Also, Table.3 is the table which arranges the data of the strength of the obtained samples A-T from upside to downside in the order of the content of sintered alumina from highest and from left side to right side in the order of the average diameter of alumina after sintering from smallest. As shown in Table.3, if the average particle diameter of alumina is same, the strength tends to be higher as the content of alumina after sintering is higher.

TABLE 3

| SINTERED OBJECT | | AVERAGE PARTICLE DIAMETER (μm) | | | | | |
|---|---|---|---|---|---|---|---|
| ALUMINA (MASS %) | BARIUM ELEMENT (MASS %) | 0.4 | 0.6 | 0.8 | 0.9 | 1.0 | 1.1 |
| 99.5 | 0 |  | A 145 MPa |  |  |  |  |
| 98.7 | 0.698 | E 125 MPa |  |  |  |  | F 190 MPa |
| 95.6 | 3.52 |  | G 123 MPa |  |  | H 190 MPa |  |
| 91.6 | 7.12 | I 105 MPa |  |  | J 170 MPa |  |  |
| 87.5 | 10.8 |  |  |  | L 90 MPa |  |  |
| 83.3 | 14.6 |  |  |  | M 70 MPa |  |  |
| 79.0 | 18.4 |  |  |  | N 36 MPa |  |  |
| 74.6 | 22.4 |  |  |  |  | O 13.6 MPa | P 17.9 MPa |
| 56.0 | 39.2 |  |  | R 2.9 MPa |  | S 1.8 MPa |  |

(Q 20.2 MPa for row 74.6 / 22.4)

| SINTERED OBJECT | | AVERAGE PARTICLE DIAMETER (μm) | | | | |
|---|---|---|---|---|---|---|
| ALUMINA (MASS %) | BARIUM ELEMENT (MASS %) | 1.2 | 1.3 | 2.0 | 2.5 | 3.5 |
| 99.5 | 0 | B 210 MPa |  |  | D 220 MPa | C 360 MPa |
| 98.7 | 0.698 |  |  |  |  |  |
| 95.6 | 3.52 |  |  |  |  |  |
| 91.6 | 7.12 |  |  | K 230 MPa |  |  |
| 87.5 | 10.8 |  |  |  |  |  |
| 83.3 | 14.6 |  |  |  |  |  |
| 79.0 | 18.4 |  |  |  |  |  |
| 74.6 | 22.4 |  |  |  |  |  |
| 56.0 | 39.2 |  |  | T 7.2 MPa |  |  |

Experimental Example 17

In FIG. 1, the conductive paste was applied the place of the wiring conductor of the ceramic plate becoming the substrate 2 and it was sintered after drying. Concretely, the substrate 2 having the power supply conductor 5 uses the alumina substrate of a purity 96% manufactured by Hokuriku-Ceramic and was made by applying the conductive paste of the grade-name "5164" made by Du-Pont to this, drying it at the temperature of 150 degree C. for ten minutes and keeping the highest temperature 850 degree C. for ten minutes.

Next, the slurry of 50 volume % was obtained by mixing 90 parts by weight of high purity alumina "AES-12" of Sumitomo-Chemical, 10 parts by weight of high purity barium carbonate "LSR" of Nippon-Chemical, 10 parts by weight of butyral as the binder, 5 parts by weight of Dioctyl Phthalate as the platicizer and 30 parts by weight of toluene as the solvent. This slurry had viscosity of 15000 cps and consisted of 85 parts by mass of alumina of the average particle diameter 0.4 μm, 15 parts by mass of barium carbonate and 15 parts by mass of resin binder (composition of olefin wax 30 and acrylic resin 70). Next, the slurry was applied on the film, the green sheet was obtained by separating from the film after drying at the temperature condition of 110 degree C. After that, the object shaped frame body was obtained by punching this green sheet by the press shaping machine to correspond to the shape of the frame body 4. The frame body 4 was sintered and made by rising temperature for ten hours, keeping temperature at 1600 degree C. for five hours and falling temperature for eight hours. Also, in this experimental example, the frame body 4 which was 7 mm-square in the planer view and had the penetration hole whose the smallest diameter portion was 3 mm and θ was 45 degrees was made. The average particle diameter of the remaining particle object of alumina of the obtained frame body 4 was 0.7 μm, the reflectance was 102% and the transverse rupture was 95 MPa.

Next, the package for the light emitting element accommodation 10 of the this example was obtained by connecting the substrate 2 placing the power supply conductor 5 and the above frame body 4 at the temperature of 120 degree C. for thirty minutes using silicone resin "SW1720CV" of Toray-Dow.

Figure 9:
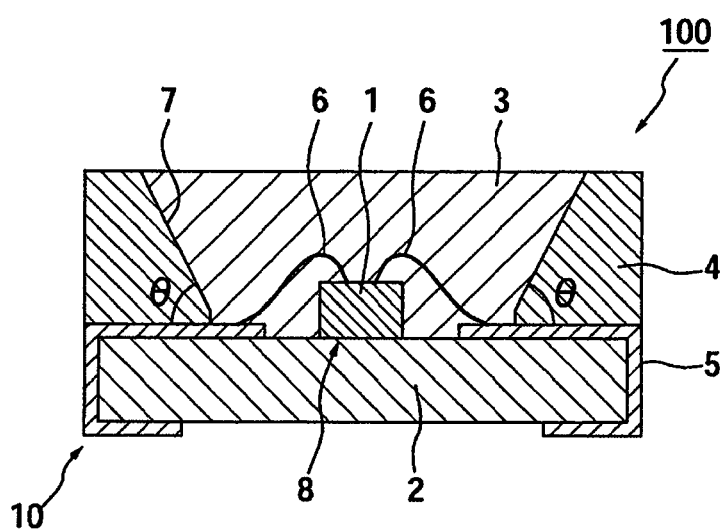
FIG. 9 is a perpendicular cross sectional view of the emitting device to show other embodiment of the invention.

Meanwhile, in the above embodiment, although the conductor mounted portion 8 is formed on the substrate 2, for example, as shown in FIG. 9, it is possible that the emitting element 1 is directly mounted on the upper surface of the substrate 2 and it is supplied with current from the outside through two bonding wires 6 and power supply conductor 5.

Figure 10:
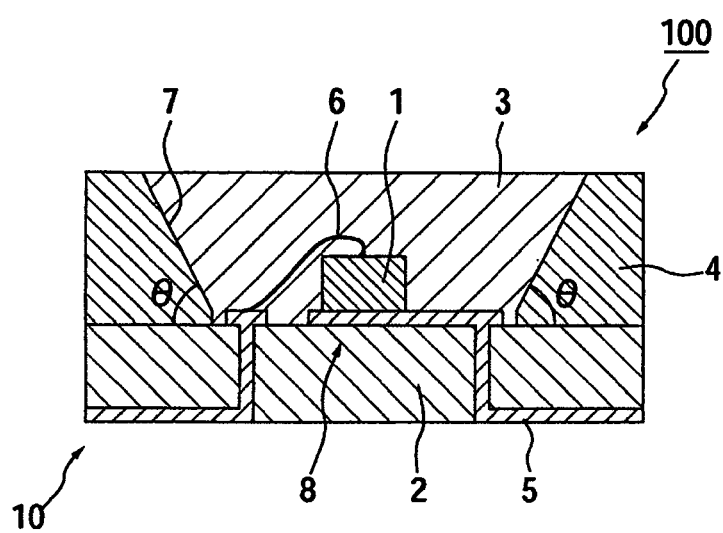
FIG. 10 is a perpendicular cross sectional view of the emitting device to show other embodiment of the invention.

Also, in the above embodiment, it is supplied with current from the outside by extending power supply conductor 5 to the upper surface edge of the substrate 2, for example, as shown in FIG. 10, it is possible that it is supplied with current from lower surface side of the substrate 2 by forming a via hole into the substrate 2.

Furthermore, it is possible that the substrate 2 and the frame body 4 are molded to be a single-piece without shaping the substrate 2 and the frame body 4 separately.

Also, in the above embodiment, although the material for light reflection is used in the frame body 4 of the package 10 for the light emitting element accommodation, it is possible that the material for light reflection is used in various backlights, displays etc., of course.

Also, in the above embodiment, although the emitting element 1 which emits blue light is shown, it is possible that the emitting element 1 is changed to the object of emitting green light or red light accordingly. Furthermore, for example, it is that the emitting device 100 obtains white light by mounting an LED element emitting blue light, an LED element emitting green light and an LED element emitting red light to the substrate 2. Furthermore, it is possible that the emitting device 100 obtains white light by containing the yellow phosphor of $(Y,Gd)_3Al_5O_{12}:Ce^{3+}$, $(Sr,Ba)_2SiO_4:Eu^{2+}$ etc. to the seal resin 3 and converting a part of blue light from the light emitting 1 to yellow light.

INDUSTRIAL APPLICABILITY

The device which has the package for the light emitting element accommodation of this invention mounted on the light emitting element is possible to apply for various indicators, light sensors, displays, photo couplers, backlights, optical printer heads etc.

What is claimed is:

1. A package for a light emitting element accommodation comprising:
    a substrate comprising of ceramic; and
    a frame body which is formed on an upper surface of the substrate and comprises ceramic which contains a light reflecting material including alumina whose average particle diameter after sintering is not more than 2.5 μm and not less than 74.6 mass %, wherein the light reflective material is exposed from an inner surface of the frame body and wherein the frame body contains a barium element at 3.52 mass %-10.8 mass %.

2. The package for a light emitting element accommodation according to claim 1, wherein the substrate has a conductor mounted portion which mounts a light emitting element on an upper surface.

3. The package for a light emitting element accommodation according to claim 1, wherein the frame body has a reflectance of at least 95%.

4. The package for a light emitting element accommodation according to claim 1, wherein the frame body has a transverse rupture strength of at least 123 MPa.

* * * * *